United States Patent [19]
Tokiguchi et al.

[11] Patent Number: 5,729,027
[45] Date of Patent: Mar. 17, 1998

[54] ION IMPLANTER

[75] Inventors: Katsumi Tokiguchi, Mito; Takayoshi Seki, Hitachi; Tetsunori Kaji, Tokuyama, all of Japan

[73] Assignee: Hitachi, Ltd., Tokyo, Japan

[21] Appl. No.: 454,548

[22] Filed: May 30, 1995

[30] Foreign Application Priority Data

May 31, 1994 [JP] Japan .................................. 6-117909

[51] Int. Cl.[6] .................................................. H01J 37/317
[52] U.S. Cl. .................................. 250/492.21; 250/398
[58] Field of Search .......................... 250/492.21, 492.2, 250/398, 423 R, 492.3

[56] References Cited

U.S. PATENT DOCUMENTS

| | | | |
|---|---|---|---|
| 3,970,854 | 7/1976 | Boroffka et al. | 250/492.21 |
| 4,754,200 | 6/1988 | Plumb et al. | 250/423 R |
| 4,782,304 | 11/1988 | Aitken | 250/423 R |
| 5,306,922 | 4/1994 | O'Connor | 250/492.21 |

FOREIGN PATENT DOCUMENTS

| | | |
|---|---|---|
| 491313A3 | 6/1992 | European Pat. Off. . |
| 565089A1 | 10/1993 | European Pat. Off. . |
| 4006740 | 1/1992 | Japan . |
| 6044935 | 2/1994 | Japan . |

*Primary Examiner*—Kiet T. Nguyen
*Attorney, Agent, or Firm*—Fay, Sharpe, Beall Fagan, Minnich & McKee

[57] ABSTRACT

An ion implanter for implementing ion implantation using mass-separated ions using a limited energy of less than 10 keV, locates the decelerator between the ion source and the mass separator, and the beam transport space provided between the ion source and the decelerator is maintained at a higher negative voltage so as to decelerate the ion beam in combination, ensuring a large-current ion beam in excess of 1 mA to be maintained on the surface of a target.

39 Claims, 2 Drawing Sheets

ION IMPLANTER

BACKGROUND OF THE INVENTION

This invention relates to an ion implanter for use in the production of ultra large scale integrated (ULSI) devices by implanting, for example, boron, phosphorus, arsenic ions or the like into silicon semiconductors, and in particular, it relates to an ion implanter which is suitable for implanting high-current boron ions in excess of 1 mA using a low implantation energy of 10 keV or less.

A prior art ion implanter comprises an ion source for producing ion beams, a mass separator for selectively separating ions having a specific mass number from other ions extracted from the ion source, and a beam irradiation chamber in which the ions having a specific mass number separated in the mass separator are implanted into a target.

High energy ion implantation is adopted in the prior art ion implanter generally in the range of several tens keV to several hundreds keV. This high energy is given to the ions by setting an extraction voltage at the ion source in the range of several tens to several hundreds kV. As an ion source, a high-current ion source which extracts ion beams from a plasma is generally employed. The current density of the ion beam extracted from the plasma increases in proportion to the power of 4/3 of the extract ion voltage. In order to obtain a sufficient beam current such that a practical implantation throughput is obtained, a beam current over 1 mA is required at the beam irradiation chamber.

For this purpose, a beam current in excess of several mA must be extracted directly from the ion beam source by considering the beam transmission efficiency in the mass separator and other ion transport components. In the prior art ion implanter where a high extraction voltage in the range of several tens to several hundreds kV can be applied, it has been easy to extract any ion beam of several mA to several hundreds mA directly from the ion beam source.

With the progress of the ULSI devices, however, it has become necessary to implant the ions within a shallower depth from the surface in order to increase the integration density; thus the implantation energy must be decreased nowadays. In particular, ion implantation with energy below 10 keV has been required. According to the prior art, however, with a decreasing extraction voltage at the ion source, the ion beam current will decrease drastically. Thus, it has been difficult to obtain a beam current in excess of 1 mA on the surface of a target with an implantation energy less than 10 keV.

SUMMARY OF THE INVENTION

The present invention has been contemplated in order to solve the above-mentioned problems associated with the prior art. The main object of the invention is to provide a high-current ion implanter which is capable of supplying a beam current in excess of 1 mA in the beam irradiation chamber, even with a low energy of 10 keV or less.

In order to ensure a high implantation beam current to be obtained in the beam irradiation chamber even if its implantation energy is reduced to less than 10 keV, a decelerator according to the invention is provided between the ion source and the mass separator. The ion source extraction voltage is set at 1 kV when 1 keV energy is required, and at 10 kV when 10 keV energy is required in the same manner as in the prior art arrangement. According to the present invention, however, in order to substantially increase the extraction current extractable from the ion source, the beam line between the ion source and the decelerator is maintained at a negative potential. Namely, the effective extraction voltage becomes the sum of the ion source voltage and the negative voltage. Further, the beam energy is decelerated in the decelerator.

In such an arrangement for causing ion beam deceleration through multi-stage electrodes applied with respective voltages in the decelerator, a beam spread occurs to some extent in the decelerator itself due to decelerating electric fields therein. At this instant, the spread beam impinges on the deceleration electrodes, thereby easily inducing a discharge between respective deceleration electrodes. A lens is placed immediately in front of the decelerator to converge the ion beam before it enters the decelerator, thereby substantially preventing the beam spread and the ion beam bombardment on the deceleration electrodes.

According to the invention, since the ion beam extraction voltage for extracting ion beams from the ion source can be set at a higher voltage in the same way as in the prior art device, a high current ion beam in excess of several mA to several hundreds mA can be extracted from the ion source. Further, since the decelerator is disposed between the ion source and the mass separator, a magnetic field required for the mass separator is sufficient if it only satisfies a magnetic field strength necessary for mass separation of ion beams having energy less than 10 keV, and which strength will be far smaller than a magnetic field strength which would be required for another version of the decelerator if it were disposed downstream of the mass separator.

Further, by suppressing the beam spread effect associated with the use of the decelerator in the manner described above, it has become possible to construct an ion beam device having the least current loss associated with deceleration.

BRIEF DESCRIPTION OF THE DRAWINGS

Other and further objects, features and advantages of the invention will be more clearly understood with reference to the accompanying drawings wherein.

PREFERRED EMBODIMENTS

With reference to the accompanying drawings, preferred embodiments of the present invention will be described in detail in the following.

Figure 1:
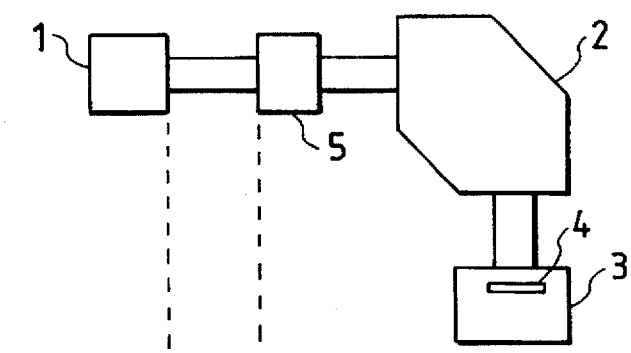
FIG. 1 is a schematic block diagram indicative of an ion implanter of one embodiment of the invention.
Figure 1:
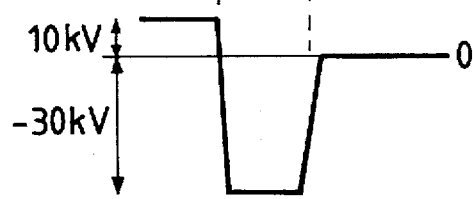

An ion implanter of one embodiment according to the invention is shown in FIG. 1. Since its schematic arrangement except for the decelerator is almost the same as that the prior art, any further description thereof will be omitted here.

This ion implanter of one embodiment of the invention includes decelerator 5 disposed between ion source 1 and mass separator 2 in order to ensure a high implantation beam current to be obtained in beam irradiation chamber 3 even when its implantation energy is reduced to less than 10 keV.

With reference to FIG. 1, the extraction voltage for extracting ion beams from the ion source 1 is set, for example, at 1 kV when a 1 keV energy is required, and at 10 kV when a 10 keV energy is required. However, in order to further increase the extracted current from the ion source 1, the space between the ion source 1 and the decelerator 5 is maintained at a negative voltage. Namely, the effective extraction voltage becomes the sum of the voltage of the ion source 1 and the negative voltage in the subsequent stage. Further, its beam energy is decelerated in the decelerator 5.

In the drawing of FIG. 1, respective potentials at respective portions constituting the arrangement of the invention are indicated typically by way of example in which an ion implantation energy of 10 keV was applied. That is the whole region from ion source 1 to decelerator 5 is maintained at a high negative voltage. All other regions downstream of the decelerator 5 are maintained at ground potential.

In association with the use of the ion beam decelerator, there occurs a problem that the beam spreads or diverges. In the arrangement of FIG. 1, with regard to its voltage distribution, the negative voltage space between the ion source 1 and the decelerator 5 is particularly noted in this invention. A large quantity of secondary electrons are produced within this space through bombardment of ion beams with residual gases and the chamber wall. Most of these secondary electrons, however flow toward the mass separator 2 which is at a higher voltage. Thereby, due to leakage of these secondary electrons which should serve to neutralize space charges of the ion beam therein, the ion beam is caused further to spread greatly by its own space charges, thereby bombarding the chamber wall in this space, losing its effective current.

Further, since the diameter of the ion beam will expand greatly due to beam divergence by the space charge effect, the transmission efficiency of the beam traveling through the decelerator 5 will eventually decrease. Hence, in order to prevent leakage or depletion of these secondary electrons, it was contemplated that if one of the multi-stage electrodes of the decelerator 5 were arranged to have a voltage lower than the negative voltage in the space mentioned above, the leakage of these secondary electrons could be prevented. According to this concept, the space charge neutralization effect due to these secondary electrons is maintained.

By way of example, as one of the extraction electrodes 1ot extracting ion beams from the ion source 1, there is provided an electrode which is negatively biased relative to the beam transport space between the ion source and the decelerator, whereby, leakage of secondary electron beams flowing toward the ion source 1 can be automatically prevented.

Figure 2:
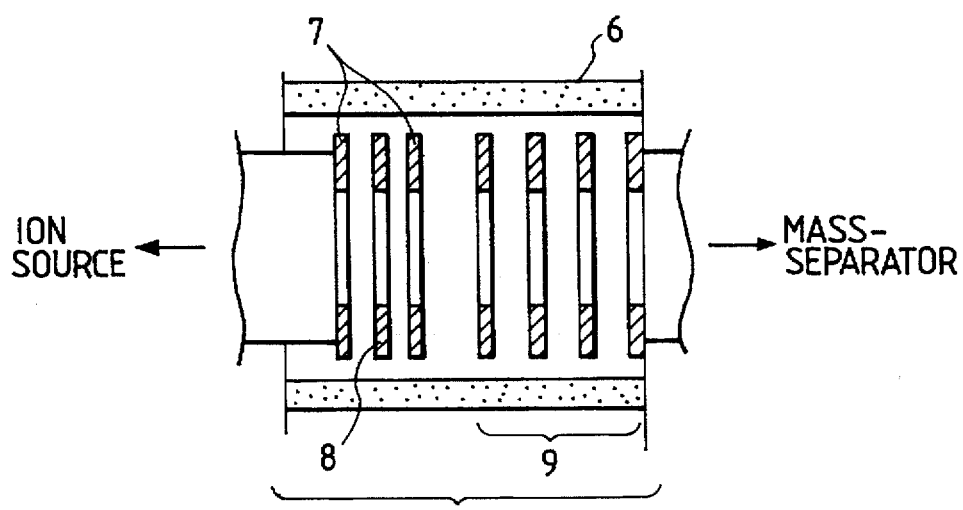
FIG. 2 is a cross-sectional view of a decelerator of one embodiment for use in the ion implanter of the invention.
Figure 2:
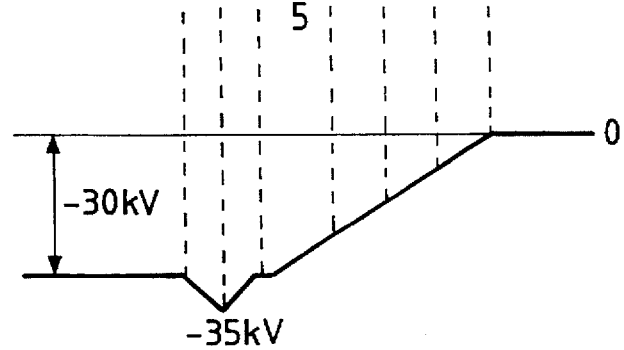

With reference to FIG. 2, a schematic arrangement of a decelerator 5 for use in the ion implanter of FIG. 1 will be described in the following.

The decelerator 5 is comprised mainly of a cylindrical dielectric insulator 6 and multi-staged decelerating electrodes 9 as indicated in the drawing of FIG. 2. In this embodiment of the invention, auxiliary electrodes 7, 8 are provided in the preceding stage of the decelerating electrodes 9. Potentials of auxiliary electrodes 7 are maintained at the same potential as that of the extraction space, more specifically at −30 kV in this embodiment, and the auxiliary electrode 8 is maintained at −35 kV. Since its potential is lower by 5 kV than the potential of the other electrodes which surround it, outflow of secondary electrons from the ion source 1 toward the mass separator 2 is prevented. Thereby, divergence of the ion beam can be minimized, allowing an efficient deceleration of the high-current ion beam to be attained.

The decelerator 5 of one embodiment of the invention having an arrangement as shown in FIG. 2 for use in the ion implanter of FIG. 1 will be described more in detail in the following.

As ion source 1, a microwave ion source which extracts ion beams from a plasma generated by a microwave discharge is utilized. $BF_3$ gas is introduced into the ion source 1 from which an ion beam which contains boron ions is extracted. Firstly, in order to facilitate an efficient ion beam extraction, the ion source 1 and the ion beam transport space are biased by a −30 kV power supply. Then, a voltage of 40 kV is applied to the ion source 1 biased by the −30 kV voltage.

Accordingly, the net potential of the ion source 1 relative to earth potential is set at 10 kV. An ion beam current to be extracted from the ion source 1 is approximately 50 mA which is the same as that obtainable by the prior art device which extracts ion beams therefrom at 40 kV. Respective decelerating electrodes 9 in the decelerator 5 are applied with appropriate voltages stepped from −30 kV to the ground potential. The boron beam current which enters the beam irradiation chamber 3 after having been subjected to deceleration and mass separation is maintained at 6 to 7 mA even with an ion beam energy of 10 keV.

Further, the voltage of the ion source 1 was decreased gradually from 10 kV to 1 kV, and subjected to mass separation after deceleration. As a result, it was found that the decrease of boron ion currents in the beam irradiation chamber was very small. That is, even at 1 keV, as much as 6 mA or more was obtained.

Figure 4:
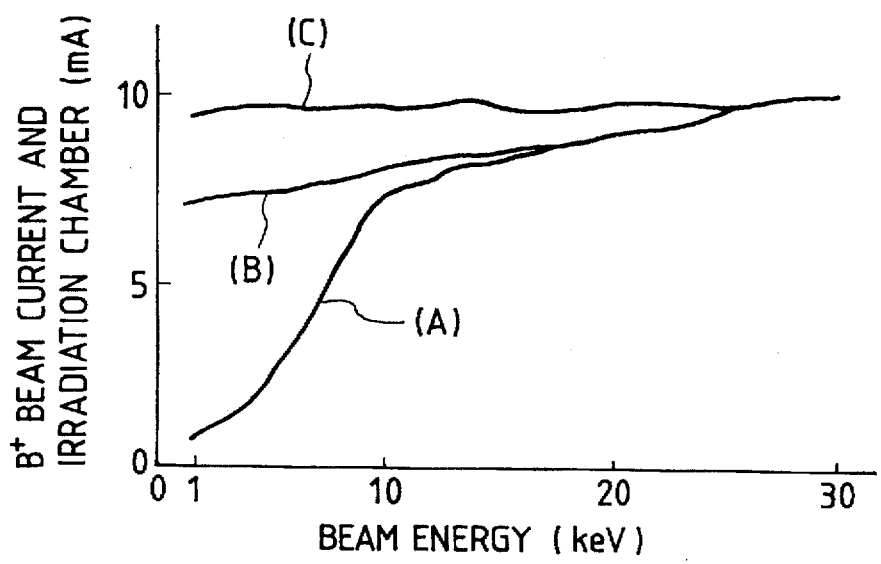
FIG. 4 is a characteristic diagram which compares boron ion currents in the beam irradiation chamber for the prior art device and the present invention.

With reference to FIG. 4, results of experiments on the obtainable currents using the prior art ion implanter and the new ion implanter of the invention employing the decelerator of FIG. 2 are indicated by curves (A) and (B), respectively.

As clearly indicated in the drawing of FIG. 4, the curve (A) for the prior art ion implanter shows a drastic decrease of the boron ion current at the beam irradiation chamber 3, while the curve (B) for the new ion implanter of the invention which utilizes the decelerator of FIG. 2 in the arrangement of FIG. 1 shows a very small decrease in the boron ion current in the beam irradiation chamber.

Figure 3:
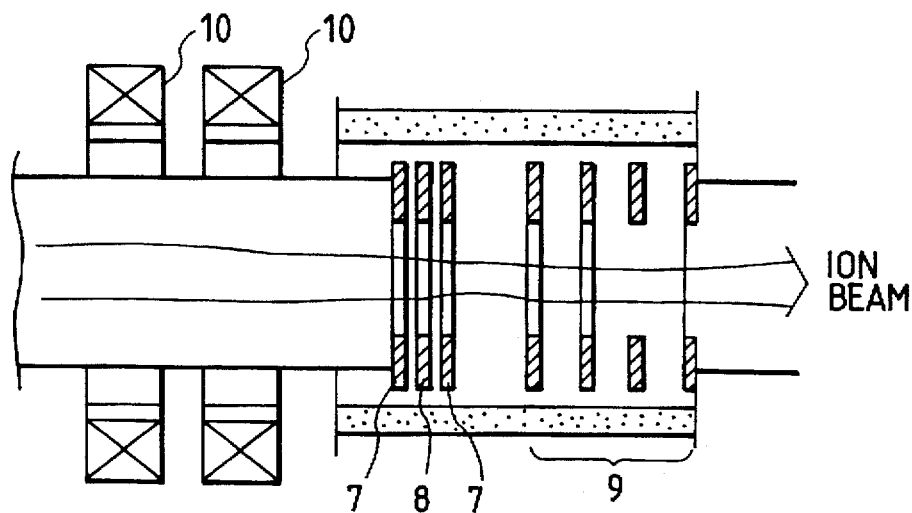
FIG. 3 is a cross-sectional view of another decelerator of another embodiment for use in the ion implanter of the invention.

With reference to FIG. 3, another embodiment of the invention is illustrated. Any ion beam deceleration arrangement of the decelerator depending on multi-staged electrodes which are applied with respective voltages may also cause a beam spread to some extent by the decelerator itself because of respective decelerating electric fields therein which introduce a lens action. If this effect occurs, the ion beam will be spread and induce ion beam bombardment to the deceleration electrodes 9 as a result, easily causing a discharge to occur between respective deceleration electrodes 9. In this embodiment of FIG. 3, the ion beam is converged through a lens 10 placed immediately before the decelerator 5 (i.e., before the ion beam enters the decelerator 5).

Namely, the lens 10 for converging the diameter of the ion beam is disposed in the preceding stage of the decelerator 5 as shown in FIG. 3. As this lens 10, a magnetic lens is adopted, and in particular, in this another embodiment of the invention, two magnetic quadruple lenses are utilized.

By addition of this lens 10, even when there occurs divergence of ion beams during deceleration, the ratio of the beam spread and bombardment on the deceleration electrodes 9 will decrease drastically. Thereby, operation of the decelerator 5 becomes stabler accordingly, and due to a reduced spread diameter of the ion beam emitted from the decelerator 5, beam loss through the beam transport line to the beam irradiation chamber is substantially reduced. It was found that when the energy was in the range of several keV, the magnetic lenses contributed greatly to a large-current sustaining function of the invention.

A curve (C) in the drawing of FIG. 4 indicates a beam current characteristic obtained in an experiment utilizing the decelerator of the embodiment of FIG. 3 which was incorporated in the ion implanter of FIG. 1. As is clear from the drawing, when an ion beam with energy less than 10 keV is desired, the large-current sustaining effect according to the embodiment of FIG. 3 is found to have played a substantial role.

By way of example, the two stage magnetic lenses were used in this embodiment as described above; however, the embodiment is not limited thereto, and any multi-stage quadrupole lenses may be used within the scope of the present invention. Further, the decelerator 5 of the invention may also be disposed between the prior art mass separator 2 and the prior art beam irradiation chamber. In this case, however, since the mass separator 5 must separate ions having a high energy of 40 keV, a higher magnetic strength is required.

In contrast, the ion implantation energy needed for mass separation of ions according to the present invention is only 10 keV. Therefore it can be clearly understood that the mass separator 2 can be reduced in size substantially. In comparison with the case where the decelerator 5 is disposed downstream of the mass separator 2, the mass separator 2 arranged according to the present invention will not require the whole portion thereof to be maintained at −30 kV, thereby reducing the power supply load and, thus, ultimately eliminating additional insulation of the mass separator 2.

The present invention has been contemplated for implementing ion implantation into semiconductors. In particular, in the preferred embodiments of the invention, mainly boron ions were tested, and a semiconductor wafer was used as target 4. However, the invention is not limited to this application, and various ions such as phosphorus or arsenic ions other than boron can be used for semiconductor implantation with a low energy in the range of several keV to several tens keV. Also, this method can be applied to ion implantation for implanting ions into targets other than semiconductors within the scope of the invention.

As described above, there have been accomplished various advantages and effects according to the ion implanter of the invention as follows. An ion implanter capable of implanting ions extracted using a lower energy (less than 10 keV) and having an excellent throughput comparable or superior to that of the prior art has been provided. Further, the inventive arrangement of the decelerator between the ion source and the mass separator has contributed to a substantial size reduction of the mass separator, thereby providing a more compact ion beam implanter.

What is claimed is:

1. An ion implanter having an ion source for generating an ion beam, a mass separator for mass-separating said ion beam extracted from said ion source, and a beam irradiation chamber in which a particular species of ions mass-separated in said mass separator are implanted into a target substrate comprising:

a decelerator provided between said ion source and said mass separator, and an ion beam transport region disposed between said ion source and said decelerator, the ion beam transport region being maintained at a negative voltage.

2. The ion implanter according to claim 1, wherein said decelerator comprises a plurality of electrodes, each being applied with a negative voltage.

3. The ion implanter according to claim 2, wherein at least one of said plurality of electrodes has a voltage that has a smaller magnitude than the negative voltage of the ion beam transport region.

4. The ion implanter according to claim 3, further comprising a lens for converging a diameter of said ion beam, the lens being provided between said ion source and said decelerator.

5. The ion implanter according to claim 4, wherein said lens comprises a plurality of magnetic lenses which each utilize a magnetic field.

6. The ion implanter according to claim 5, wherein said plurality of magnetic lenses are quadrupole lenses.

7. The ion implanter according to claim 3, wherein said target substrate comprises a semiconductor wafer, wherein said ions to be implanted in the semiconductor wafer are one of boron ions, phosphor ions, and arsenic ions, and wherein an implantation energy of such ions is limited to 10 keV or less.

8. The ion implanter according to claim 7, wherein said ion beam is extracted from said ion source using a positive extraction voltage that is less than or equal to 10 kV.

9. The ion implanter according to claim 3, wherein said ion beam is extracted from said ion source using a positive extraction voltage that is less than or equal to 10 kV.

10. The ion implanter according to claim 3, wherein said ion beam is extracted from said ion source using a positive extraction voltage that is equal to 1 kV.

11. The ion implanter according to claim 3, wherein said target substrate comprises a semiconductor wafer, wherein said ions to be implanted in the semiconductor wafer are one of boron ions, phosphor ions, and arsenic ions; wherein said ion beam is extracted from said ion source using a positive extraction voltage that is equal to 1 kV; and wherein an implantation energy of such ions is 1 keV.

12. The ion implanter according to claim 2, further comprising a lens for converging a diameter of said ion beam, the lens being provided between said ion source and said decelerator.

13. The ion implanter according to claim 12, wherein said lens comprises a plurality of magnetic lenses which each utilize a magnetic field.

14. The ion implanter according to claim 13, wherein said plurality of magnetic lenses are quadrupole lenses.

15. The ion implanter according to claim 2, wherein said target substrate comprises a semiconductor wafer, wherein said ions to be implanted in the semiconductor wafer are one of boron ions, phosphor ions, and arsenic ions, and wherein an implantation energy of such ions is limited to 10 keV or less.

16. The ion implanter according to claim 15, wherein said ion beam is extracted from said ion source using a positive extraction voltage that is less than or equal to 10 kV.

17. The ion implanter according to claim 2, wherein said ion beam is extracted from said ion source using a positive extraction voltage that is less than or equal to 10 kV.

18. The ion implanter according to claim 2, wherein said ion beam is extracted from said ion source using a positive extraction voltage that is equal to 1 kV.

19. The ion implanter according to claim 2, wherein said target substrate comprises a semiconductor wafer, wherein said ions to be implanted in the semiconductor wafer are one of boron ions, phosphor ions, and arsenic ions; wherein said ion beam is extracted from said ion source using a positive extraction voltage that is equal to 1 kV; and wherein an implantation energy of such ions is 1 keV.

20. The ion implanter according to claim 1, further comprising a lens for converging a diameter of said ion beam, the lens being provided between said ion source and said decelerator.

21. The ion implanter according to claim 20, wherein said lens comprises a plurality of magnetic lenses which each utilize a magnetic field.

22. The ion implanter according to claim 21, wherein said plurality of magnetic lenses are quadrupole lenses.

23. The ion implanter according to claim 20, wherein said target substrate comprises a semiconductor wafer, wherein said ions to be implanted in the semiconductor wafer are one of boron ions, phosphor ions, and arsenic ions, and wherein an implantation energy of such ions is limited to 10 keV or less.

24. The ion implanter according to claim 23, wherein said ion beam is extracted from said ion source using a positive extraction voltage that is less than or equal to 10 kV.

25. The ion implanter according to claim 20, wherein said ion beam is extracted from said ion source using a positive extraction voltage that is less than or equal to 10 kV.

26. The ion implanter according to claim 20, wherein said ion beam is extracted from said ion source using a positive extraction voltage that is equal to 1 kV.

27. The ion implanter according to claim 20, wherein said target substrate comprises a semiconductor wafer, wherein said ions to be implanted in the semiconductor wafer are one of boron ions, phosphor ions, and arsenic ions; wherein said ion beam is extracted from said ion source using a positive extraction voltage that is equal to 1 kV; and wherein an implantation energy of such ions is 1 keV.

28. The ion implanter according to claim 1, wherein said target substrate comprises a semiconductor wafer, wherein said ions to be implanted in the semiconductor wafer are one of boron ions, phosphor ions, and arsenic ions, and wherein an implantation energy of such ions is limited to 10 keV or less.

29. The ion implanter according to claim 28, wherein said ion beam is extracted from said ion source using a positive extraction voltage that is less than or equal to 10 kV.

30. The ion implanter according to claim 1, wherein the ion beam transport region is maintained at −30 kV.

31. The ion implanter according to claim 30, wherein said ion beam is extracted from said ion source using a positive extraction voltage that is less than or equal to 10 kV.

32. The ion implanter according to claim 30, wherein said ion beam is extracted from said ion source using a positive extraction voltage that is equal to 1 kV.

33. The ion implanter according to claim 1, wherein said ion beam is extracted from said ion source using a positive extraction voltage that is less than or equal to 10 kV.

34. The ion implanter according to claim 1, wherein said ion beam is extracted from said ion source using a positive extraction voltage that is equal to 1 kV.

35. The ion implanter according to claim 1, wherein said target substrate comprises a semiconductor wafer, wherein said ions to be implanted in the semiconductor wafer are one of boron ions, phosphor ions, and arsenic ions; wherein said ion beam is extracted from said ion source using a positive extraction voltage that is equal to 1 kV; and wherein an implantation energy of such ions is 1 keV.

36. The ion implanter according to claim 1, wherein the decelerator includes at least one electrode by which the ion beam passes in the decelerator, and wherein an initial one of said at least one electrode by which the ion beam first passes in the decelerator is maintained at a negative voltage.

37. The ion implanter according to claim 36, wherein the initial decelerator electrode by which the ion beam first passes in the decelerator is maintained at the same voltage as the voltage of the ion beam transport region.

38. The ion implanter according to claim 37, wherein the decelerator includes a plurality of electrodes, wherein one of the decelerator electrodes subsequent to the initial decelerator electrode is maintained at a negative voltage of greater magnitude than that of the initial decelerator electrode.

39. The ion implanter according to claim 1, wherein the decelerator includes at least one electrode by which the ion beam passes in the decelerator, and wherein an initial one of said at least one electrode by which the ion beam first passes in the decelerator is maintained at a voltage that is less than an extraction voltage by which the ion beam is extracted from said ion source.

\* \* \* \* \*